United States Patent
Iyengar

(10) Patent No.: US 11,316,530 B2
(45) Date of Patent: Apr. 26, 2022

(54) ADAPTIVE COMPRESSION FOR DATA SERVICES

(71) Applicant: International Business Machines Corporation, Armonk, NY (US)

(72) Inventor: Arun Iyengar, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 16/367,400

(22) Filed: Mar. 28, 2019

(65) Prior Publication Data

US 2019/0222224 A1    Jul. 18, 2019

Related U.S. Application Data

(63) Continuation of application No. 14/985,511, filed on Dec. 31, 2015, now Pat. No. 10,270,465.

(51) Int. Cl.
| | | |
|---|---|---|
| G06F 16/00 | (2019.01) | |
| H03M 7/30 | (2006.01) | |
| H04L 67/568 | (2022.01) | |
| H04L 69/04 | (2022.01) | |
| H04L 67/1097 | (2022.01) | |

(52) U.S. Cl.
CPC ........... *H03M 7/6094* (2013.01); *H03M 7/30* (2013.01); *H04L 67/2842* (2013.01); *H04L 69/04* (2013.01); *H04L 67/1097* (2013.01)

(58) Field of Classification Search
None
See application file for complete search history.

(56) References Cited

U.S. PATENT DOCUMENTS

| | | |
|---|---|---|
| 9,584,620 B1 | 2/2017 | Iyengar |
| 9,742,866 B2 | 8/2017 | Shribman et al. |
| 2002/0010702 A1 | 1/2002 | Ajtai et al. |
| 2003/0013859 A1 | 1/2003 | Franzini et al. |
| 2003/0105852 A1 | 6/2003 | Das et al. |
| 2003/0115420 A1 | 6/2003 | Tsirigotis |
| 2005/0015374 A1 | 1/2005 | Reinauer et al. |
| 2005/0071579 A1* | 3/2005 | Luick ................. G06F 12/0802 711/154 |
| 2005/0114408 A1 | 5/2005 | Gold et al. |
| 2005/0138404 A1 | 6/2005 | Weik et al. |
| 2005/0193096 A1 | 9/2005 | Yu et al. |
| 2007/0128899 A1 | 6/2007 | Mayer |
| 2008/0177994 A1 | 7/2008 | Mayer |

(Continued)

OTHER PUBLICATIONS

Arun K. Iyengar et al., "Enhanced Storage Clients," U.S. Appl. No. 15/986,123, filed May 22, 2018—May 22, 2018.

(Continued)

*Primary Examiner* — Tuankhanh D Phan
(74) *Attorney, Agent, or Firm* — Fleit Intellectual Property Law; Jose Gutman

(57) ABSTRACT

A method, system, and computer program product for data compression in storage clients. In some embodiments, a storage client for accessing a storage service from a computer program is provided. A compression method is provided in the storage client to reduce a size of data objects. A frequency of compressing data from the computer program or modifying a compression algorithm based on assessing costs and benefits of compressing the data is varied.

20 Claims, 10 Drawing Sheets

(56) References Cited

U.S. PATENT DOCUMENTS

| | | | |
|---|---|---|---|
| 2009/0182945 A1 | 7/2009 | Aviles et al. | |
| 2009/0228647 A1 | 9/2009 | Klems et al. | |
| 2009/0268903 A1 | 10/2009 | Bojinov et al. | |
| 2011/0214015 A1 | 9/2011 | Li et al. | |
| 2013/0013859 A1 | 1/2013 | Zhu et al. | |
| 2013/0305039 A1* | 11/2013 | Gauda | G06F 21/6218 713/153 |
| 2014/0114936 A1 | 4/2014 | Araki et al. | |
| 2014/0244585 A1 | 9/2014 | Sivasubram et al. | |
| 2014/0359226 A1 | 12/2014 | Pan | |
| 2015/0067819 A1 | 3/2015 | Shribman et al. | |
| 2015/0326862 A1* | 11/2015 | Akenine-Moller | H04N 19/428 375/240.08 |
| 2017/0116135 A1 | 4/2017 | Sundaravaradan et al. | |
| 2017/0192897 A1 | 7/2017 | Iyengar | |
| 2017/0193028 A1 | 7/2017 | Iyengar | |
| 2017/0194987 A1 | 7/2017 | Iyengar | |
| 2017/0195446 A1 | 7/2017 | Iyengar | |
| 2018/0024853 A1 | 1/2018 | Warfield et al. | |

OTHER PUBLICATIONS

Arun K. Iyengar et al., "Delta Encoding in Storage Clients," U.S. Appl. No. 14/985,513, filed Dec. 31, 2015—Jul. 6, 2017.
Arun K. Iyengar et al., "Data Compression in Storage Clients," U.S. Appl. No. 14/985,511, filed Dec. 31, 2015—Jul. 6, 2017.
Arun K. Iyengar et al., "Enhanced Storage Clients," U.S. Appl. No. 14/985,509, filed Dec. 31, 2015—Jul. 6, 2017.
List of IBM Patents or Patent Applications Treated as Related.

* cited by examiner

ADAPTIVE COMPRESSION FOR DATA SERVICES

BACKGROUND

The present disclosure relates to data storage, and more particularly, to methods, systems and computer program products for data compression in storage clients.

There are a wide variety of ways of storing data persistently, particularly with cloud-based systems. These include file systems, relational databases (e.g. DB2, MySQL, SQL Server), and NoSQL systems (e.g. Redis, CouchDB/Cloudant, HBase, Hazelcast, MongoDB). It is typical to have an application program store data persistently using a client. There are a number of problems with storage clients, such as a client will typically work for only a single back-end storage system or that the performance for accessing the back-end storage systems can be significant. The problem is often much worse in cloud environments, where the distance to cloud servers can add tens (or even hundreds) of milliseconds of latency. In some instances, the persistent storage system might become unavailable due to failures or network problems. This can be a problem if the client is communicating remotely with a cloud server and does not have good connectivity.

SUMMARY

In accordance with an embodiment, a method for data compression in storage clients is provided. The method may include providing a storage client for accessing a storage service from a computer program; providing a compression method in the storage client to reduce a size of data objects; and varying a frequency of compressing data from the computer program or modifying a compression algorithm based on assessing costs and benefits of compressing the data.

In another embodiment, a computer program product may comprise a non-transitory storage medium readable by a processing circuit and storing instructions for execution by the processing circuit for performing a method that may include providing a storage client for accessing a storage service from a computer program; providing a compression method in the storage client to reduce a size of data objects; and varying a frequency of compressing data from the computer program or modifying a compression algorithm based on assessing costs and benefits of compressing the data.

In another embodiment, a system may include a processor in communication with one or more types of memory. The processor may be configured to provide a storage client for accessing a storage service from a computer program; provide a compression method in the storage client to reduce a size of data objects; and vary a frequency of compressing data from the computer program or modify a compression algorithm based on assessing costs and benefits of compressing the data.

BRIEF DESCRIPTION OF THE DRAWINGS

The forgoing and other features, and advantages of the disclosure are apparent from the following detailed description taken in conjunction with the accompanying drawings in which.

DETAILED DESCRIPTION

Figure 1:
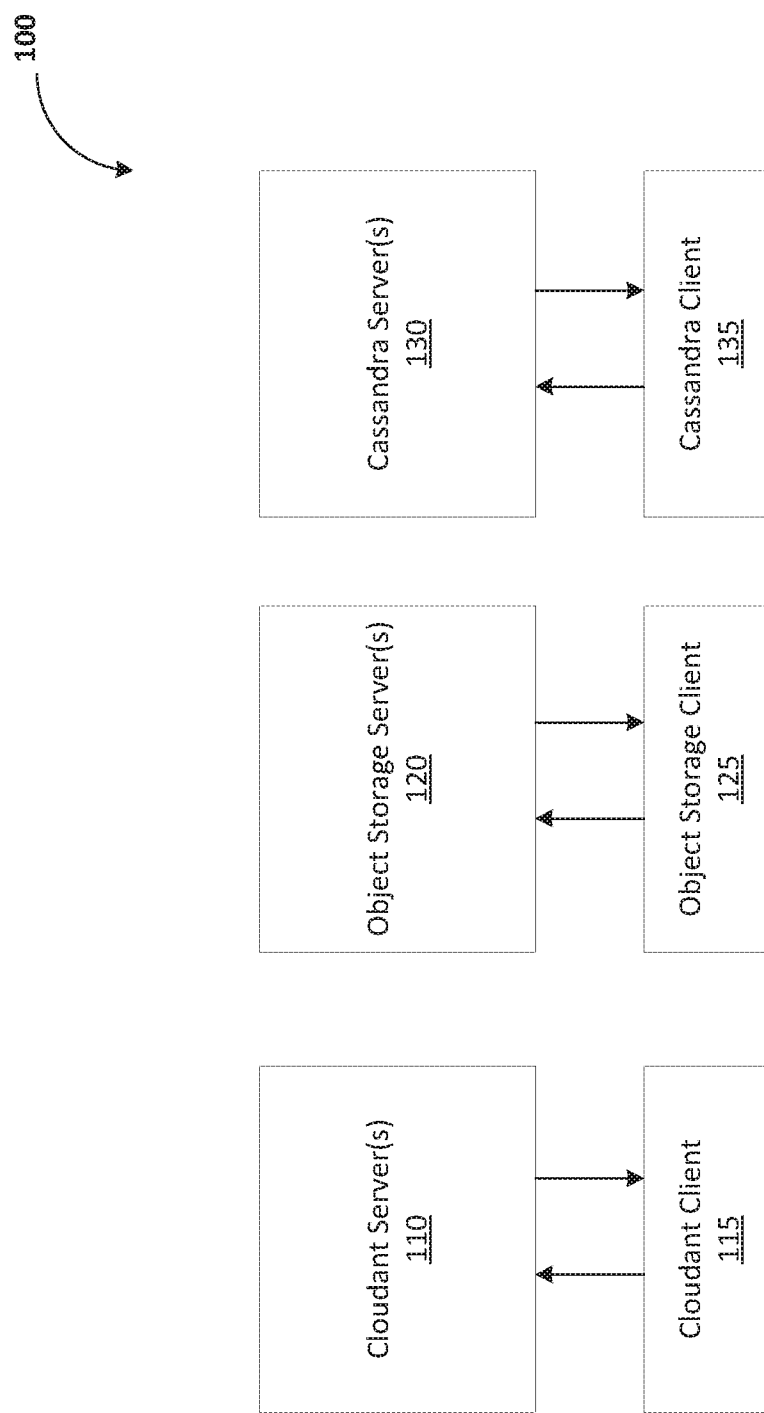
FIG. 1 is a block diagram illustrating a computing environment that includes multiple storage clients and storage servers in accordance with an exemplary embodiment.

In accordance with exemplary embodiments of the disclosure, methods, systems and computer program products for data compression in storage clients, which offer access to multiple back-end storage systems, improved performance, and higher availability than previous systems. It is particularly applicable to the cloud where there are multiple storage services available and latency for accessing a cloud storage service can be high.

The systems and methods described herein may provide enhanced storage capabilities, a broad selection of storage options, optimize latency for accessing cloud storage systems (e.g., move significant data handling capabilities into client), may avoid overhead of remote storage, and may avoid sending confidential data.

In some embodiments, an application may use multiple cloud storage systems or change from using one cloud storage system to another. A cloud storage manager may be provided as a layer above the cloud storage system, which allows an application to easily use multiple cloud storage systems and provides additional services not provided by cloud storage systems. The cloud storage manager may provide a storage interface for applications to use. The storage interface may be built for each cloud storage system of interest. In some embodiments, applications may access cloud storage through the storage interface. Substituting different cloud storage systems may not require changes to an application. Options for key-value stores, relational databases, and file systems may be provided by the cloud storage manager.

The methods and systems described herein are directed to the design and implementation of storage clients, which offer access to multiple back-end storage systems, improved performance, and higher availability of storage capabilities. It is particularly applicable to the cloud where there are multiple storage services available and latency for accessing a cloud storage service can be high.

In some embodiments, the storage client may handle multiple back-end systems. The storage client may define a key-value interface. Any back-end storage system, which implements the key-value interface, may use the storage client.

If the server supports delta encoding, then the server may make the choice as to whether to decode a delta and store the full object or to just store the delta. In many cases, the server may not have the ability to decode a delta. In this case, the client may instruct the server to simply store a delta from the previous version. After a certain number of deltas, the client may send a full object (not just the delta) to the server. That way, the server does not have to keep accumulating deltas. Note that the client may perform all delta encoding and decoding (if necessary). The server does not have to understand how to perform delta encoding or decoding.

The systems and methods described herein may provide encryption. Users might desire all data stored persistently to be encrypted. Therefore, the storage client may provide data encryption and decryption capabilities.

Some embodiments of the disclosure may be directed to support users who have poor connectivity. The caches described herein may provide a method for users to continue to run an application when connectivity is poor. When connectivity is restored, a remote storage service can be updated in batches.

FIG. 1 is a block diagram illustrating a computing environment 100 that includes multiple storage clients and storage servers in accordance with an exemplary embodiment. In some embodiments, storage systems (which may be offered over the cloud) such as Cloudant, Object Storage (which implements the OpenStack Swift API), and Cassandra typically have clients (e.g., Cloudant client 115, Object Storage client 125, Cassandra client 135), which application programs use to communicate with the actual storage servers (e.g., Cloudant server(s) 110, Object Storage server(s) 120, Cassandra server(s) 130). Although this disclosure is discussed in the context of cloud storage systems, the systems and methods described herein may be applicable to other types of storage systems. In some cases, the clients (e.g., Cloudant client 115, Object Storage client 125, Cassandra client 135) can be language specific (e.g. written for a specific programming language, such as Java, Python, JavaScript). For example, a Java client might be designed with an API allowing Java programs to use the API using Java method calls. Other storage clients have other types of API's. For example, a Rest API would allow applications to access a storage system using HTTP. The systems and methods described herein may be compatible with a wide variety of types of client (and server) APIs for accessing storage systems, including but not limited to method and/or function calls from conventional programming languages, protocols (e.g. HTTP, XML, JSON, SOAP, many others), and several other established methods for specifying interfaces.

Although the disclosure discusses Cloudant, Object Storage, and Cassandra, these services are merely exemplary and other systems and methods described herein may be applied to different cloud or remote systems or services.

Figure 2:
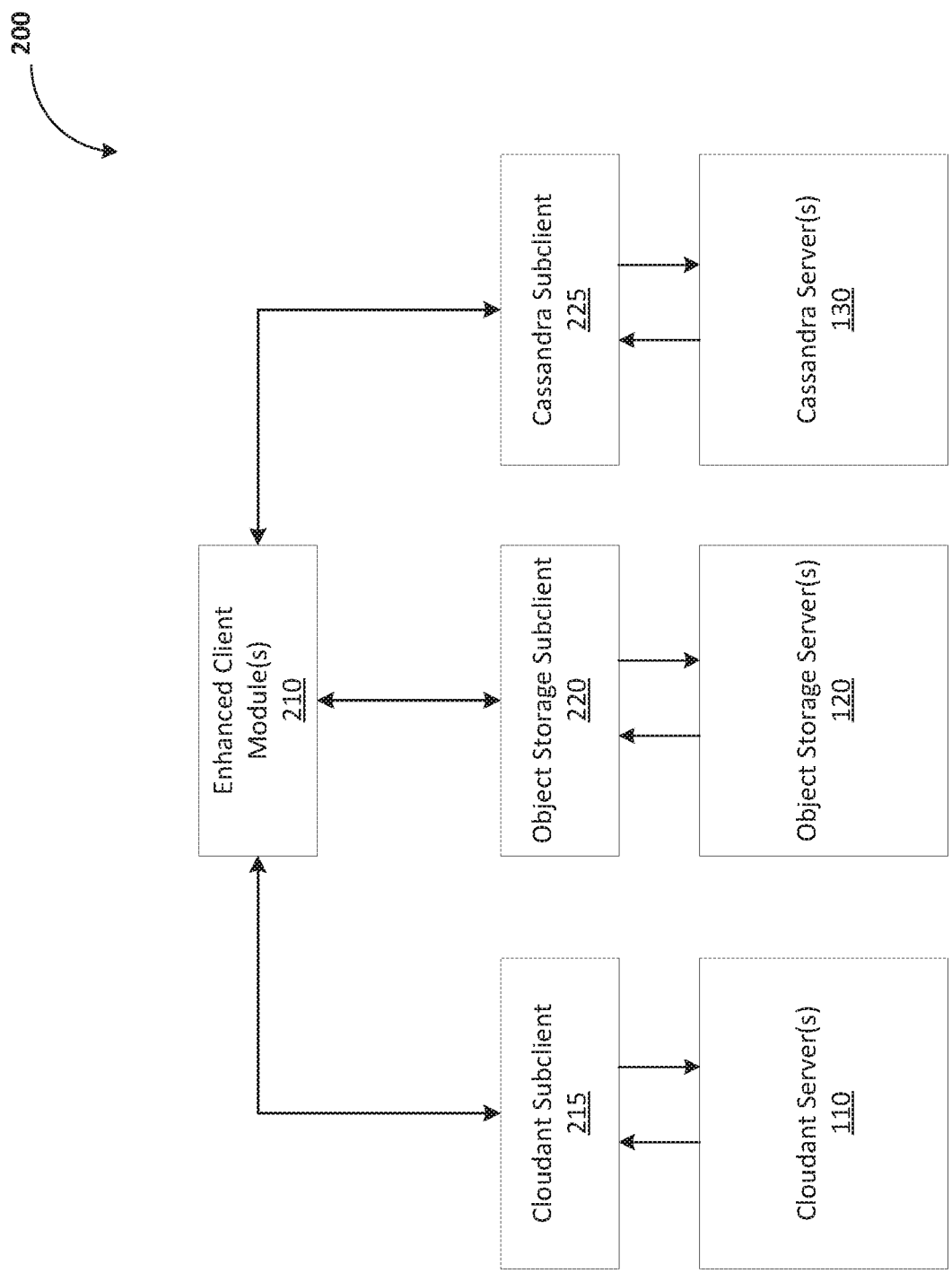
FIG. 2 is a block diagram illustrating an architecture of an enhanced client in accordance with an exemplary embodiment.

FIG. 2 is a block diagram illustrating an architecture 200 of an enhanced storage client in accordance with an exemplary embodiment. The enhanced storage client may handle multiple back-end systems. The enhanced storage client may include the enhanced client module 210 and the cloud service subclients (e.g., Cloudant subclient 215, Object Storage subclient 220, Cassandra subclient 225). This enhanced storage client allows application programs to communicate with multiple different back-end storage systems (e.g., Cloudant server(s) 110, Object Storage server(s) 120, Cassandra server(s) 130).

In some embodiments, a key-value interface may be implemented for the enhanced storage client, which may be standardized across all back-end storage systems. Any back-end storage system may use the key-value interface by implementing a subclient (e.g., Cloudant subclient 215) that implements the key-value interface over a back-end storage system (e.g., Cloudant server(s) 110). In this case, an application program can use the back-end storage system by communicating with the enhanced client. It should be noted that the subclient (e.g., Cloudant subclient 215) may implement other methods for communicating with the back-end storage system beyond just the key-value interface. The application has the option of using the back-end-specific methods in the subclient for communicating with the back-end storage system, in addition to the enhanced client key-value interface, which is standard across all back-end storage systems. That way, the application program still has the full generality of the features for the back-end storage system. The key-value interface does not limit the usage of the back-end storage system by an application program, since the application program can bypass the key-value interface and use the back-end storage system-specific API calls from the subclient. Other implementations (besides key-value interfaces) are also possible for the enhanced clients.

Figure 3:
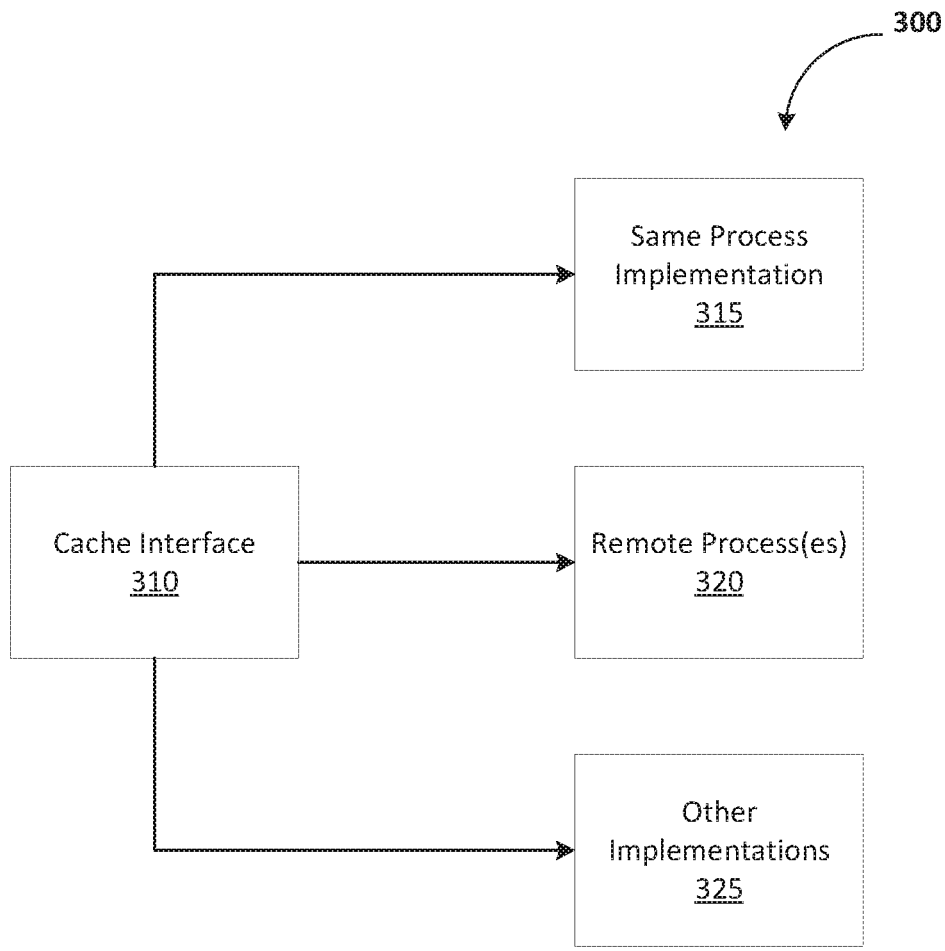
FIG. 3 is a block diagram illustrating a cache interface with multiple implementations in accordance with an exemplary embodiment.
Figure 4:
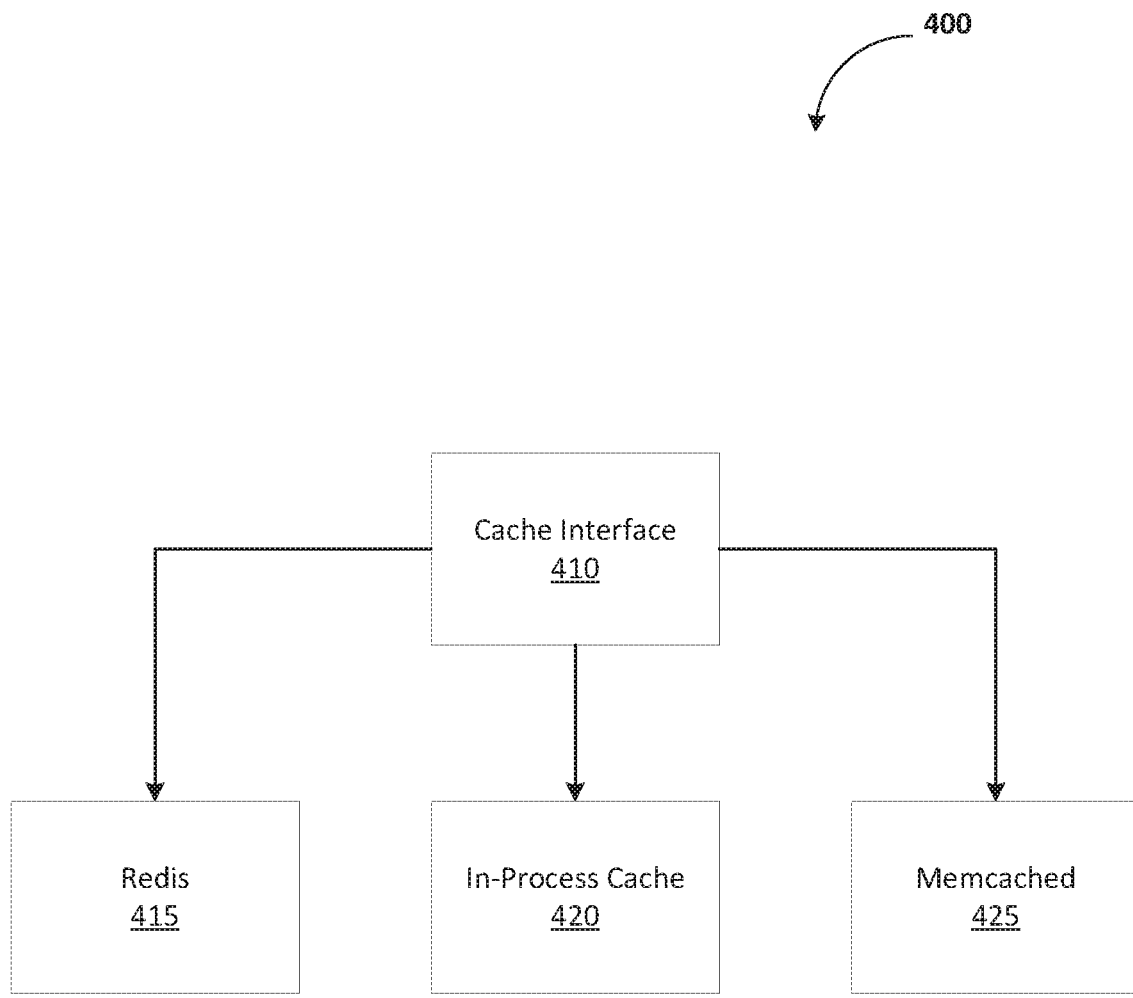
FIG. 4 is a block diagram illustrating another depiction of a cache interfaces with multiple implementations in accordance with an exemplary embodiment.

FIGS. 3-4 are discussed collectively. Caching be used to improve performance and may be useful in cloud-based storage systems in which the client (e.g., Cloudant client 115) is remote from the storage server (e.g., Cloudant server(s) 110). In such embodiments, the physical distance between the client and server may add to the latency for storage operations. In some embodiments, the caches may be integrated directly with the client (e.g., Cloudant client 115, Object Storage client 125, Cassandra Client 135), which may enhance functionality and performance of the clients. Additionally, the integration of the caches with the clients may be a feature for application programmers. If application programmers have to implement their own caching solutions outside of the client, it may require considerably more work, and the performance of such caching solutions may not be as good.

FIG. 3 is a block diagram illustrating an environment 300 with a cache interface 310 with multiple implementations in accordance with an exemplary embodiment. Multiple caches may be used within the enhanced storage clients. In some embodiments, to utilize a particular cache, the cache interface 310 may be implemented on top of the particular cache. The modular cache design may include a cache interface 310, a same process implementation 315 as the client (e.g., an in-process cache, which may store data in the same process as the application program), a remote process(es) 320, which may be an open source cache such as Redis 415 and memcached 425, and other implementations 325 (e.g., an open source cache such as Ehcache or Guava caches). The in-process cache 420 may store data in the same process as the application program.

FIG. 4 is a block diagram illustrating another environment 400 of a cache interfaces 410 with multiple implementations in accordance with an exemplary embodiment. In some embodiments, the cache design may be modular. Multiple caches may be used within our enhanced clients. In order to use a particular cache, the cache interface 410 should be implemented on top of a cache (e.g., as illustrated in FIGS. 3-4). The in-process cache 420 may store data in the same process as the application program.

Figure 5:
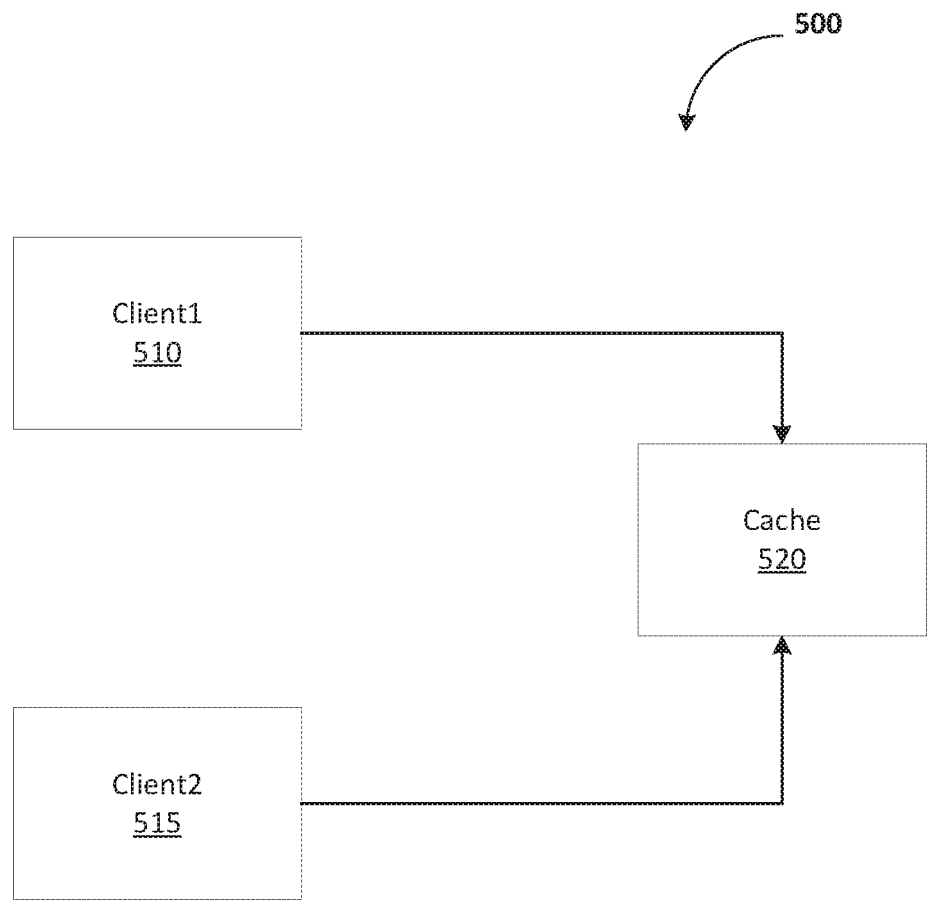
FIG. 5 is a block diagram illustrating a remote process cache implementation in accordance with an exemplary embodiment.

FIG. 5 is a block diagram illustrating a remote process cache implementation 500 in accordance with an exemplary embodiment. In some embodiments, two types of caches may be utilized: in-process and remote process. In-process caches may operate in the same process as the application process. They have the advantage of being fast. Data (e.g., cached objects) does not need to be serialized in order to be cached. The cache is not shared with other clients or applications.

Remote process caches 520 (e.g. Redis, memcached) execute in different processes from the application program. They have the advantage that they can be shared by multiple clients (e.g., Client1 510, Client2 515) and applications. Furthermore, they can scale to many processes (which can execute on the same or distinct computing nodes). On the negative side, there is some overhead for the interprocess communication that is required for applications/clients to communicate with the cache(s) 520. In addition, cached data may need to be serialized, which introduces additional overhead.

When the cache 520 becomes full, a method may be needed to determine which object to remove from the cache 520 to make room for other objects. This process is known as cache replacement. One of the most widely used cache replacement algorithms is to replace the object which was accessed most distantly in the past (least recently used, or LRU). Other cache replacement algorithms (e.g. greedy-dual size) are also possible. Different cache replacement algorithms are also compatible with the methods and systems described herein.

Figure 6:
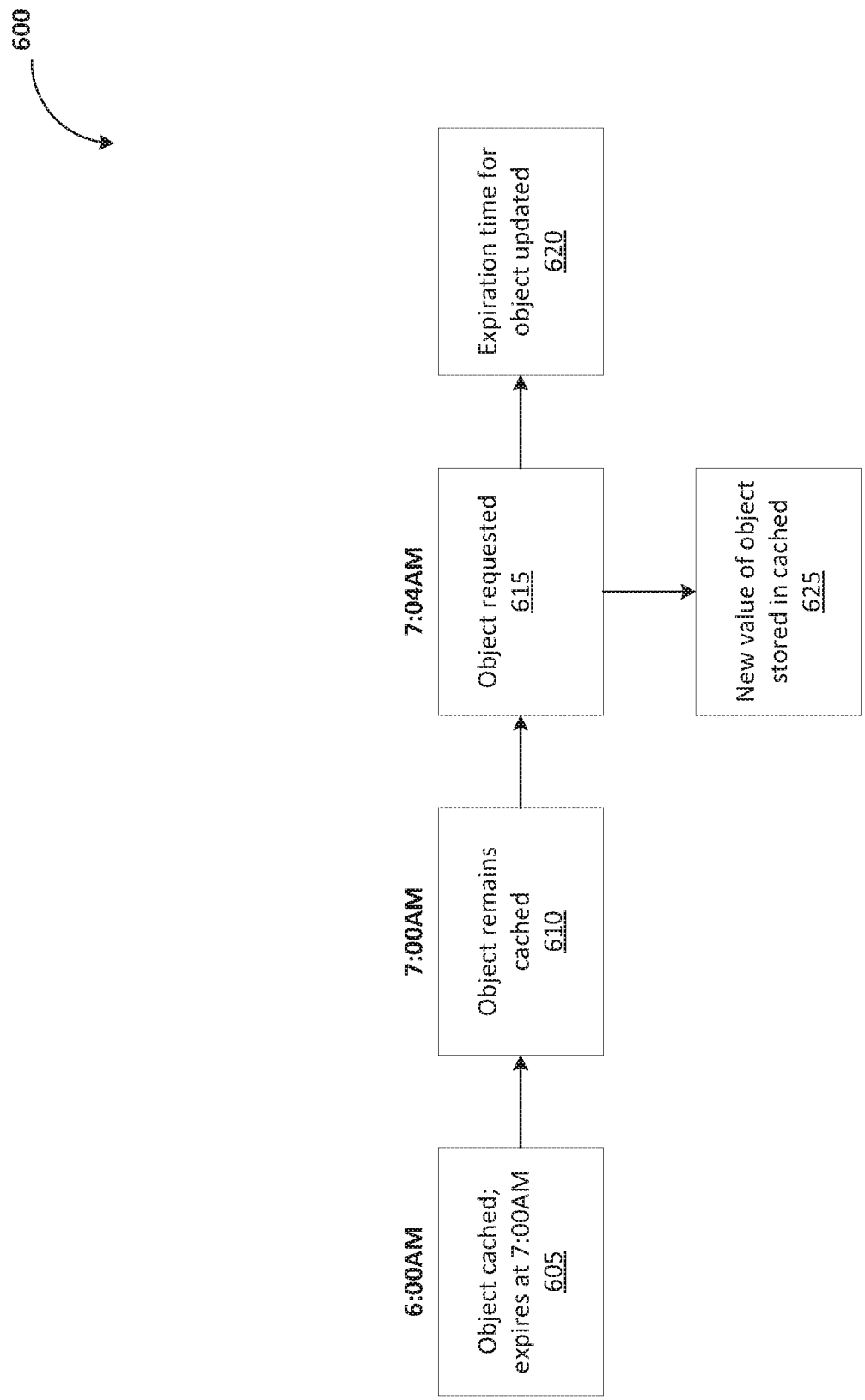
FIG. 6 is a flow diagram illustrating a method for handling cached objects which have expired in accordance with an exemplary embodiment.

FIG. 6 is a flow diagram illustrating a method 600 for handling cached objects, which have expired in accordance with an exemplary embodiment. In some embodiments, cached objects may have expiration times associated with them. Once the expiration time for a cached object has passed, the object is no longer valid. Cached objects may be deleted from the cache after they have expired. Alternatively, they can be kept in the cache after their expiration times, permitting cached objects that have expired but are still current to remain in the cache.

For example, at block 605, an object (o1) with an expiration time of 7:00 AM may be cached at 6:00 AM. At block 610, at 7:00 AM, o1 may remain cached. At block 615, at 7:04 AM, o1 may be requested. When o1 is requested, the server is contacted to see if the version of o1 in the cache is still current (e.g., a get-if-modified-since request may be transmitted to the server). If the server indicates that o1 is still current, the method may proceed to block 620, where the expiration time associated with o1 is updated using a new expiration time provided by the server. This may save network bandwidth (depending on the size of o1) since o1 does not need to be unnecessarily fetched from the server. If the cached version of o1 is determined to be obsolete at block 615, then the method may proceed to block 625. At block 625, the server may send an updated version of o1 to the client, and the cache may be updated using the updated version of o1 received from the server.

Figure 7:
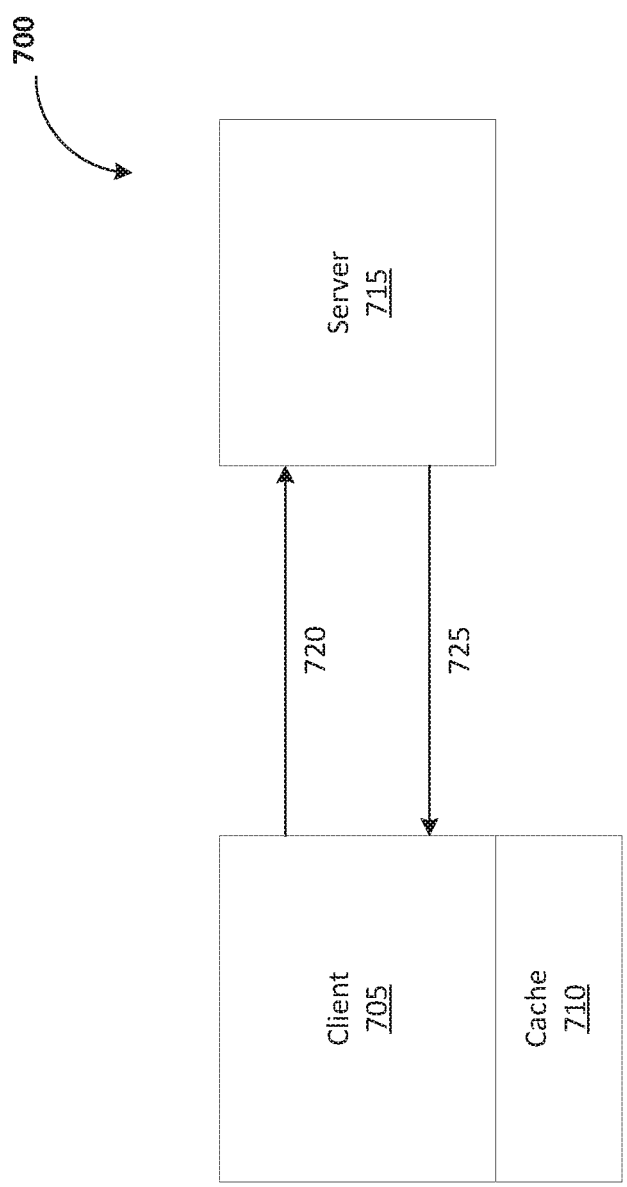
FIG. 7 is a diagram illustrating a method for handling poor and/or limited connectivity in accordance with an exemplary embodiment.

FIG. 7 is a diagram illustrating a method 700 for handling poor and/or limited connectivity in accordance with an exemplary embodiment. In some embodiments, the cache 710 integrated with the enhanced storage client may be used to mitigate connectivity problems between the client 705 and server 715. During periods when the server 715 is unresponsive (e.g., not responding within a predetermined length of time) and/or the cost to communicate with the server is high (e.g., resources exceed an predetermined threshold), an application (which may be implemented by one or more computer programs) can operate by using the cache 710 for storage instead of the server 715. At data exchanges 720 and 725, the client 705 and server 715 may communicate to transmit batch updates or initiate synchronization when the connectivity is deemed to be responsive (e.g., server 710 responds to a client request within a predetermined period of time).

FIG. 7 depicts a situation in which an application using the client 705 relies upon the cache 710 when connectivity between the client 705 and the server 715 is poor. If the server(s) 715 are not responding or is responding too slowly, the application may use the cache 710 for storage instead of the server 715. When server 715 response times improve, the application may start using the storage server 715 again. At this point, several messages might have to be exchanged between the client 705 and the server 715 to make the contents of the cache 710 and the cloud storage server(s) 715 consistent. For example, if the application has updated of to version v2 at 7:35 in the cache 710 and the cloud storage server 715 has a previous version of o1 from 7:30, then version v2 of o1 is stored at the cloud storage server(s) 715. If the cache 710 is storing o2 version v3 and the storage server 715 has a newer version v4 of o2, then version v4 of o2 is stored in the cache 710.

The client 705 may make adaptive decisions of how frequently to use the cache 710 based on the responsiveness of the server 715. The client 705 may monitor the time it takes for server(s) 715 to respond to client requests. When the server 715 is slow to respond, the client 705 can increase the frequency it uses for caching data. When the server 715 is responding relatively quickly without significant delays, the client 705 can decrease the frequency it uses for caching. For example, suppose that the average time for getting a response from the server 715 increases by 70%. This might result in the client 705 increasing the percentage of requests that it directs to the cache 710. The client 705 might choose to store data in the cache 710 more frequently. It might also choose to retrieve data from the cache 710 more frequently without checking with the server 715 to determine if the cached data is the most current version.

Suppose the average time for getting a response from the server 715 decreases by 50%. The client 705 might choose to use the cache 710 less frequently. For example, it might store data more frequently at the server 715 instead of caching it. It might also choose to more frequently check with the server 715 to determine if a cached object is current.

Figure 8:
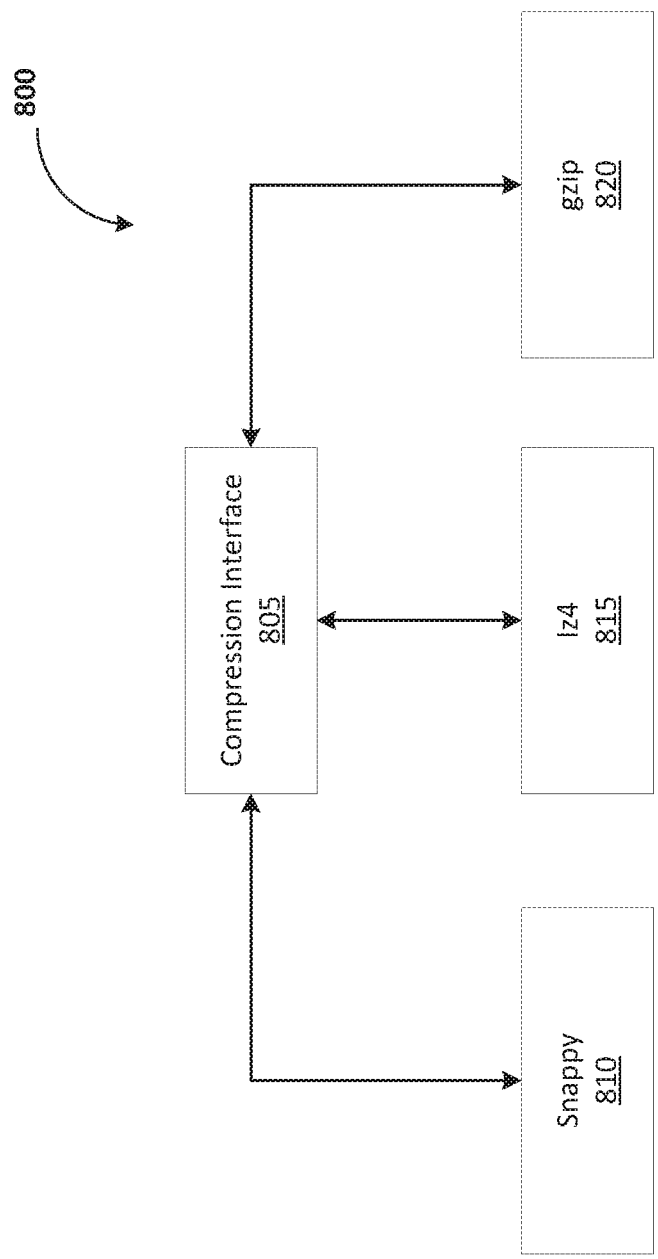
FIG. 8 is a block diagram illustrating a compression interface with multiple implementations in accordance with an exemplary embodiment.

FIG. 8 is a block diagram illustrating a compression interface 805 with multiple implementations in accordance with an exemplary embodiment. In some embodiments, the enhanced storage client may be used to reduce the overhead of large data objects. This may be handled by both data compression and delta encoding. The enhanced storage client may have the ability to compress objects prior to storage and to decompress them upon retrieval.

In some embodiments, the compression design may be modular. In some embodiments, the compression interface 805 may be defined. Multiple compression algorithms may be used within our enhanced clients. In order to use a particular compression algorithm, the compression interface 805 may be implemented on top of the compression algorithm.

In some embodiments, compression techniques described herein may include adaptive compression in which the amount and degree of compression can be varied based on run-time conditions. In some embodiments, it may be desirable to perform compression when cache space is low (e.g., below a predetermined threshold, where the threshold may be modified by a user), since a compressed object takes up less cache space. Similarly, it may be desirable to perform compression when space in the storage service is low, since a compressed object takes up less storage service space. Sometimes, there is a cost to storing data with the storage service. If this cost goes up, it becomes more desirable to perform compression before storing a data object with the storage service.

In some embodiments, the bandwidth between the client and the server can affect performance. When that bandwidth is low (e.g., below a predetermined threshold), it becomes more desirable to compress data objects before sending them from the client to the server. Compression may take up CPU cycles. Therefore, when the client CPU is heavily utilized, it may be less desirable to perform compression. When the client CPU is lightly utilized, it becomes more desirable to perform compression.

Not all data objects compress equally well. The client can predict from the type of a data object whether it is a good candidate for compression based on empirical evidence it has on how well similar data objects have compressed in the past. If the client determines that little space is likely to be saved by compressing a data object (o1), then it may not be desirable to compress o1, as doing so would incur some CPU overhead. If the client determines that considerable space can be saved by compressing o1, then it may be desirable to compress o1. Examples of compression algorithms that may be used by the compression interface 805 may include, but are not limited to Snappy 810, Iz4 815, and/or gzip 820.

In some embodiments, the client may control the amount of compression by varying the frequency with which it will compress a data object. If the client determines that compression is desirable, it may compress data objects frequently (e.g., a set number of times during a given time period). If the client determines that compression is not desirable, it can compress data objects less frequently (e.g., fewer times in a given time period).

In some embodiments, the enhanced storage clients may allow different types of compression algorithms to be used. Some compression algorithms are efficient at compressing data, while others are not as efficient but have the advantage of using fewer CPU cycles. The data compression ratio is the uncompressed data size of an object divided by the compressed data size. The data compression ratio is dependent on both the data object and the compression algorithm. In general, an algorithm with a higher compression ratio will result in more compression at the cost of higher CPU overhead. If a data compression algorithm consumes more CPU cycles without improvement in compression ratio, it is probably not a good algorithm to use.

The enhanced storage client may have the capability to increase the amount of compression, via some combination of increasing the frequency of data compression and/or using data compression algorithm(s) with a higher compression ratio(s) in response to one or more of the following:
1. The amount of free cache space available to the computer program falls below a threshold.
2. The amount of free space in the storage service available to the computer program falls below a threshold.
3. Available bandwidth between the computer program and the storage service falls below a threshold.
4. A cost for storing data on the storage service increases.
5. The type of the data object currently being stored has a higher compression ratio.
6. The CPU utilization of the client decreases.

The enhanced storage clients may have the capability to decrease the amount of compression, via some combination of decreasing the frequency of data compression and/or using data compression algorithm(s) with lower CPU overhead (which generally means a lower compression ratio) in response to one or more of the following:
1. The amount of free cache space available to the computer program rises above a threshold.
2. The amount of free space in the storage service available to the computer program rises above a threshold.
3. Available bandwidth between the computer program and the storage service rises above a threshold.
4. A cost for storing data on the storage service decreases.
5. The type of the data object currently being stored has a lower compression ratio.
6. The CPU utilization of the client increases.

In some embodiments, the overhead may be reduced by delta encoding. Delta encoding is useful when a client is sending updated objects to the server. Instead of sending the full object each time, the client can send only a delta (e.g., the difference between the current version and the last stored version on the server). In many cases, deltas are only a small fraction of the size of the complete object.

If the server supports delta encoding, then the server may make the choice as to whether to decode a delta and store the full object or to just store the delta. In many cases, the server will not have the ability to decode a delta. The client can instruct the server to simply store a delta from a previous version. After a certain number of deltas, the client can send a full object (not just the delta) to the server. That way, the server does not have to keep accumulating deltas. Note that the client can perform all delta encoding and decoding (if necessary). The server does not have to understand how to perform delta encoding or decoding.

Delta encoding enables a client storing multiple updates to an object (o1) to send the deltas (e.g., changes) resulting in the new objects $d_1, d_2, \ldots, d_n$ instead of the entire copies of the updated objects. Accordingly, less information needs to be sent from the client to the server. At some point, the client might send a full updated object instead of a delta. There are multiple ways in which a client might make a decision to send a full version of an object instead of a delta:
1. The client might wait until the number of previous deltas it has sent since sending the last full version of the object has exceeded a threshold.
2. The client might wait until the total number of bytes contained in deltas exceeds a threshold.
3. The client might make a determination of the cost to construct an updated object by applying deltas to the previous version of the object stored at the server. Once this cost exceeds a threshold, the client then sends a full version of the object instead of a delta.
4. The decision can also be made in a large number of other ways within the spirit and scope of the invention.

When a client sends a delta $d_i$ for o1, the server may retain the previous version of o1 and all other deltas needed to construct the updated version of o1 from the previous version. In order to reconstruct an updated version of o1 from an earlier version, deltas are used to construct the updated version of o1. The updated version can be constructed by the server, the client, or by another party. The fact that the server does not have to apply deltas to reconstruct the object means that enhanced storage clients can use delta encoding without the server having special support for delta encoding. The server can be unaware that delta encoding is actually being implemented.

In some cases, a client may have to determine the value of o1 when it does not have a copy of o1 stored locally. Instead, o1 is represented by a previous version and multiple deltas on the server. If the server does not have the capability to decode deltas, the previous version of o1 and the subsequent deltas can be retrieved by the client from the server. The client then determines an updated version of o1 by applying the deltas to the previous version of o1.

When the client successfully stores a full updated version of o1 instead of a delta on the server, the previous version of o1 stored on the server, as well as previous deltas applicable to this previous version of o1, can be deleted from the server. This saves space.

Figure 9:
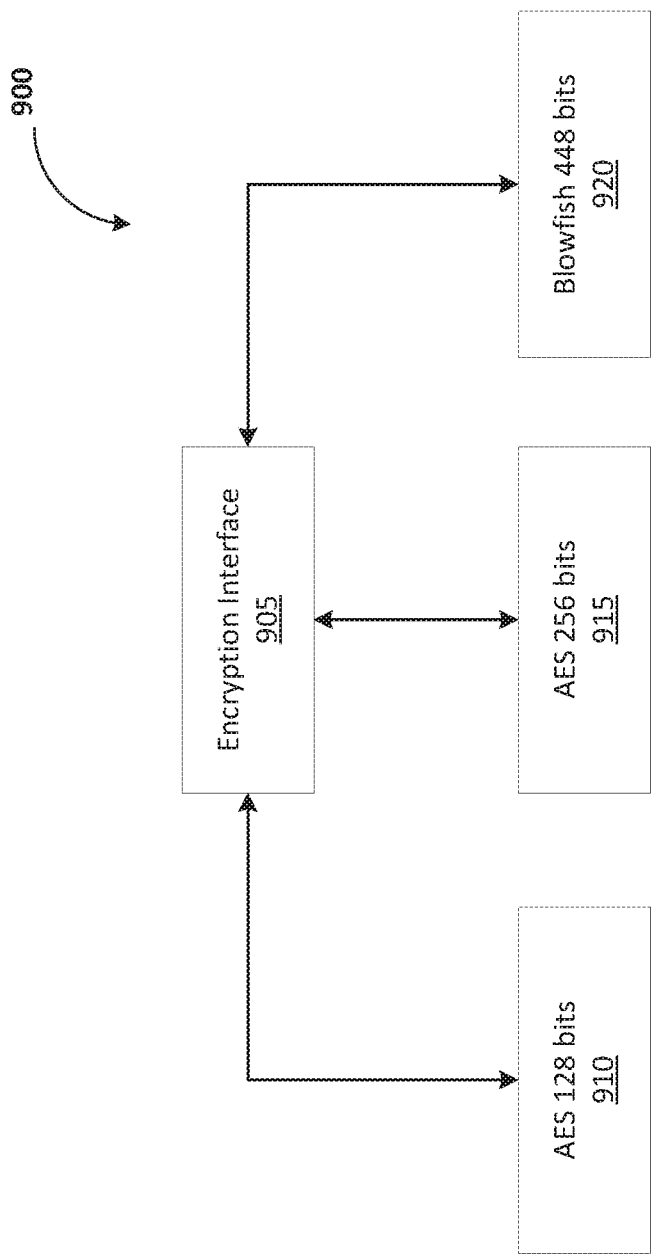
FIG. 9 is a block diagram illustrating an encryption interface with multiple implementations in accordance with an exemplary embodiment.

FIG. 9 is a block diagram illustrating an environment 900 with an encryption interface with multiple implementations in accordance with an exemplary embodiment. In some embodiments, users may want all data stored persistently to be encrypted, which may be provided by the enhanced storage client. In some embodiments, the encryption design may be modular. An encryption interface may be defined 905. Multiple encryption algorithms can be used within the enhanced clients. In order to use a particular encryption algorithm, the encryption interface may be implemented on top of the particular encryption algorithm. In some embodiments, users can encrypt data using encryption algorithms, such as AES 128 bits 910, AES 256 bits 915, or Blowfish 448 bits 920. Using the enhanced storage client, users may encrypt data before it is ever stored in a server, or before the data is cached.

Figure 10:
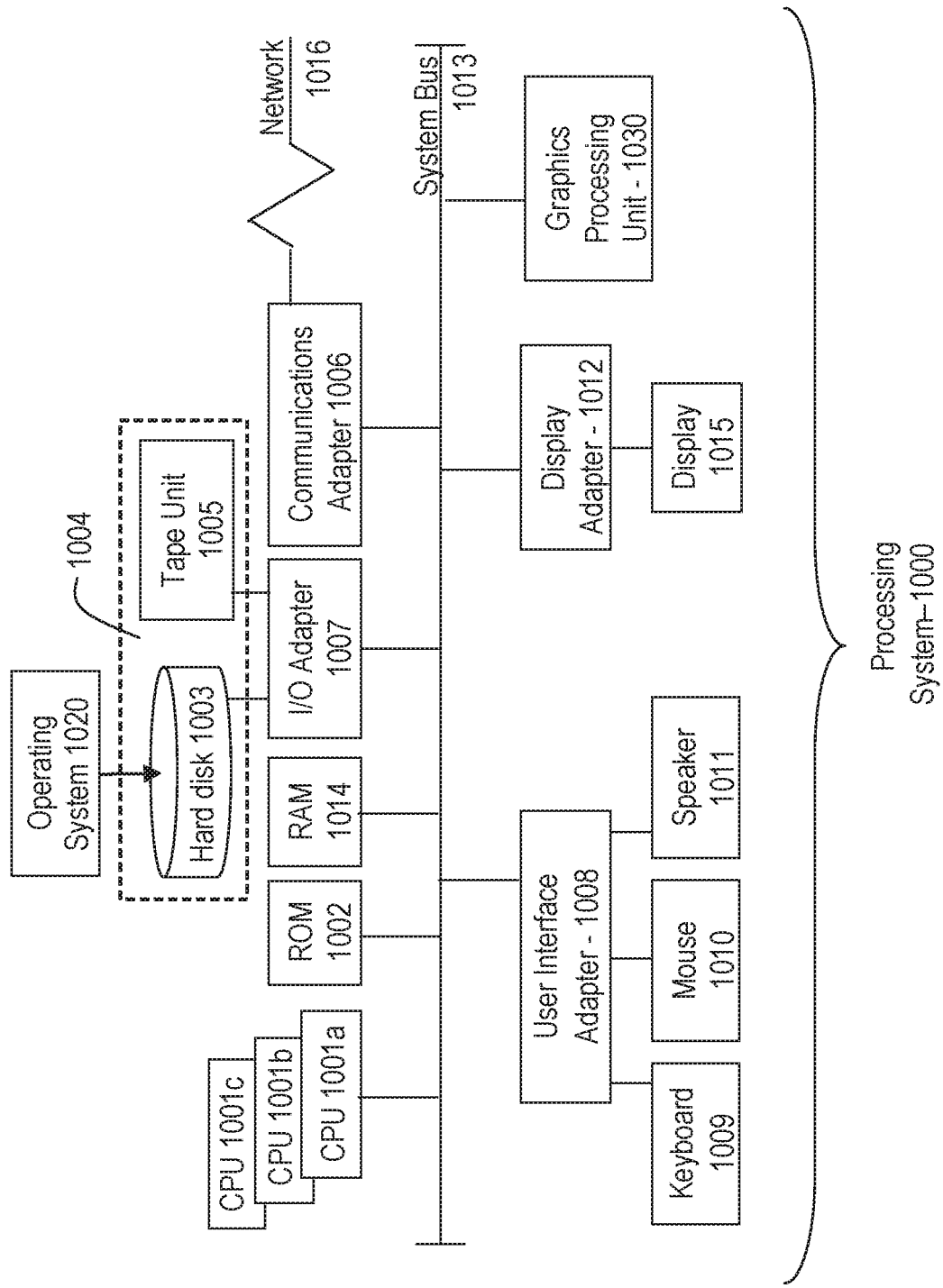
FIG. 10 is a block diagram illustrating one example of a processing system for practice of the teachings herein.

Referring to FIG. 10, there is shown an embodiment of a processing system 1000 for implementing the teachings herein. In this embodiment, the system 1000 has one or more central processing units (processors) 1001a, 1001b, 1001c, etc. (collectively or generically referred to as processor(s) 1001). In one embodiment, each processor 1001 may include a reduced instruction set computer (RISC) microprocessor. Processors 1001 are coupled to system memory 1014 and various other components via a system bus 1013. Read only memory (ROM) 1002 is coupled to the system bus 1013 and may include a basic input/output system (BIOS), which controls certain basic functions of system 1000.

FIG. 10 further depicts an input/output (I/O) adapter 1007 and a network adapter 1006 coupled to the system bus 1013. I/O adapter 1007 may be a small computer system interface (SCSI) adapter that communicates with a hard disk 1003 and/or tape storage drive 1005 or any other similar component. I/O adapter 1007, hard disk 1003, and tape storage device 1005 are collectively referred to herein as mass storage 1004. Operating system 1020 for execution on the processing system 1000 may be stored in mass storage 1004. A network adapter 1006 interconnects bus 1013 with an outside network 1016 enabling data processing system 1000 to communicate with other such systems. A screen (e.g., a display monitor) 1015 is connected to system bus 1013 by display adaptor 1012, which may include a graphics adapter to improve the performance of graphics intensive applications and a video controller. In one embodiment, adapters 1007, 1006, and 1012 may be connected to one or more I/O busses that are connected to system bus 1013 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 1013 via user interface adapter 1008 and display adapter 1012. A keyboard 1009, mouse 1010, and speaker 1011 all interconnected to bus 1013 via user interface adapter 1008, which may include, for example, a Super I/O chip integrating multiple device adapters into a single integrated circuit.

In exemplary embodiments, the processing system 1000 includes a graphics-processing unit 1030. Graphics processing unit 1030 is a specialized electronic circuit designed to manipulate and alter memory to accelerate the creation of images in a frame buffer intended for output to a display. In general, graphics-processing unit 1030 is very efficient at manipulating computer graphics and image processing, and has a highly parallel structure that makes it more effective than general-purpose CPUs for algorithms where processing of large blocks of data is done in parallel.

Thus, as configured in FIG. 10, the system 1000 includes processing capability in the form of processors 1001, storage capability including system memory 1014 and mass storage 1004, input means such as keyboard 1009 and mouse 1010, and output capability including speaker 1011 and display 1015. In one embodiment, a portion of system memory 1014 and mass storage 1004 collectively store an operating system such as the AIX® operating system from IBM Corporation to coordinate the functions of the various components shown in FIG. 10.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method comprising:
    providing a storage client for accessing a storage service from a computer program, wherein the storage client is implemented with software and the storage service is running on at least one computer;
    the storage client storing data objects using the storage service;
    providing at least one compression algorithm, implemented with software, in the storage client to reduce a size of data objects;
    compressing, with the storage client, data objects at a first frequency; and
    varying a frequency of compression of data objects from the first frequency to a second frequency, different from the first, or varying a type of compression algorithm based on assessing, with the storage client software, that a change has occurred to at least one of: available bandwidth to transfer data between the storage client and the storage server, computational resources for performing compression, available space for storing data, cost of available bandwidth to transfer data between the storage client and the storage server, cost of computational resources for performing compression, or cost of available space for storing data.

2. The computer-implemented method of claim 1, further comprising:
    providing a cache within the storage client for reducing a number of accesses to the storage service.

3. The computer-implemented method of claim 2, wherein varying the frequency of compression of data objects further comprises:
    increasing the frequency of compressing data objects or using a type of compression algorithm with a higher data compression ratio when the amount of free cache space available to the computer program falls below a threshold.

4. The computer-implemented method of claim 1, wherein varying the frequency of compression of data objects further comprises:
    increasing the frequency of compressing data objects or using a type of compression algorithm with a higher data compression ratio when the amount of free space in the storage service available to the computer program falls below a threshold.

5. The computer-implemented method of claim 1, wherein varying the frequency of compression of data objects further comprises:

increasing the frequency of compressing data objects or using a type of compression algorithm with a higher data compression ratio when an available bandwidth between the storage client and the storage service falls below a threshold.

6. The computer-implemented method of claim 1, wherein varying the frequency of compression of data objects further comprises:
increasing the frequency of compressing data objects or using a type of compression algorithm with a higher data compression ratio when the storage client determines that a cost for storing data on the storage service increases above a predetermined threshold.

7. The computer-implemented method of claim 1, wherein varying the frequency of compression of data objects further comprises:
determining data compression ratios for different datatypes; and
increasing the frequency of compressing data objects or using a type of compression algorithm with a higher data compression ratio for datatypes with higher data compression ratios.

8. The computer-implemented method of claim 1, wherein varying the frequency of compression of data objects further comprises:
monitoring a CPU usage on at least one computing node performing compression; and
increasing the frequency of compressing data objects or using a type of compression algorithm with a higher data compression ratio when the monitored CPU usage decreases.

9. The computer-implemented method of claim 1, further comprising:
providing an encryption method in the storage client to preserve data privacy.

10. A computer program product comprising a non-transitory storage medium readable by a processing circuit and storing instructions for execution by the processing circuit for performing a method comprising:
providing a storage client for accessing a storage service from a computer program, wherein the storage client is implemented with software and the storage service is running on at least one computer;
the storage client storing data objects using the storage service;
providing at least one compression algorithm, implemented with software, in the storage client to reduce a size of data objects;
compressing, with the storage client, data objects at a first frequency; and
varying a frequency of compression of data objects from the first frequency to a second frequency, different from the first, or varying a type of compression algorithm based on assessing, with the storage client software, that a change has occurred to at least one of: available bandwidth to transfer data between the storage client and the storage server, computational resources for performing compression, available space for storing data, cost of available bandwidth to transfer data between the storage client and the storage server, cost of computational resources for performing compression, or cost of available space for storing data.

11. The computer program product of claim 10, wherein varying the frequency of compression of data objects further comprises:
increasing the frequency of compressing data objects or using a type of compression algorithm with a higher data compression ratio when the amount of free space in the storage service available to the computer program falls below a threshold.

12. The computer program product of claim 10, wherein varying the frequency of compression of data objects further comprises:
increasing the frequency of compressing data objects or using a type of compression algorithm with a higher data compression ratio when an available bandwidth between the computer program and the storage service falls below a threshold.

13. The computer program product of claim 10, wherein varying the frequency of compression of data objects further comprises:
increasing the frequency of compressing data objects or using a type of compression algorithm with a higher data compression ratio when the storage client determines that a cost for storing data on the storage service increases above a predetermined threshold.

14. The computer program product of claim 10, wherein varying the frequency of compression of data objects further comprises:
determining data compression ratios for different datatypes; and
increasing the frequency of compressing data objects or using a type of compression algorithm with a higher data compression ratio for datatypes with higher data compression ratios.

15. The computer program product of claim 10, wherein varying the frequency of compression of data objects further comprises:
monitoring a CPU usage on at least one computing node performing compression; and
increasing the frequency of compressing data objects or using a type of compression algorithm with a higher data compression ratio when the monitored CPU usage decreases.

16. A system, comprising:
a processor in communication with one or more types of memory, the processor configured to:
provide a storage client for accessing a storage service from a computer program, wherein the storage client is implemented with software and the storage service is running on at least one computer;
the storage client storing data objects using the storage service;
provide at least one compression algorithm, implemented with software, in the storage client to reduce a size of data objects;
compress, with the storage client, data objects at a first frequency; and
vary a frequency of compression of data objects from the first frequency to a second frequency, different from the first, or vary a type of compression algorithm based on assessing, with the storage client software, that a change has occurred to at least one of: available bandwidth to transfer data between the storage client and the storage server, computational resources for performing compression, available space for storing data, cost of available bandwidth to transfer data between the storage client and the storage server, cost of computational resources for performing compression, or cost of available space for storing data.

17. The system of claim 16, wherein the processor is further configured to:

integrate a cache within the storage client for reducing a number of accesses to the storage service.

18. The system of claim 17, wherein, to vary the frequency of compression of data objects, the processor is further configured to:
increase the frequency of compressing data objects or use a type of compression algorithm with a higher data compression ratio when the amount of free cache space available to the computer program falls below a threshold.

19. The system of claim 16, wherein, to vary the frequency of compression of data objects, the processor is further configured to:
increase the frequency of compressing data objects or using a type of compression algorithm with a higher data compression ratio when the storage client determines that a cost for storing data objects on the storage service increases above a predetermined threshold.

20. The computer-implemented method of claim 1, wherein at least one of the plurality of the storage services is a cloud service.

* * * * *